United States Patent
Kotani et al.

(10) Patent No.: US 7,426,712 B2
(45) Date of Patent: Sep. 16, 2008

(54) LITHOGRAPHY SIMULATION METHOD AND RECORDING MEDIUM

(75) Inventors: Toshiya Kotani, Tokyo (JP); Shigeki Nojima, Yokohama (JP); Shoji Mimotogi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 245 days.

(21) Appl. No.: 11/485,554

(22) Filed: Jul. 13, 2006

(65) Prior Publication Data
US 2007/0019058 A1    Jan. 25, 2007

(30) Foreign Application Priority Data
Jul. 13, 2005    (JP)    ............... 2005-204146

(51) Int. Cl.
G06F 17/50 (2006.01)
G03F 9/00 (2006.01)
(52) U.S. Cl. ............................. 716/19; 430/5
(58) Field of Classification Search ........... 716/19; 430/5

See application file for complete search history.

(56) References Cited

U.S. PATENT DOCUMENTS 5,563,012 A * 10/1996 Neisser ................. 430/22
5,889,686 A    3/1999 Mimotogi et al.
6,617,083 B2    9/2003 Usui et al.
7,363,611 B2 *    4/2008 Rosenbluth ............... 716/21

* cited by examiner

Primary Examiner—Jack Chiang
Assistant Examiner—Magid Y Dimyan
(74) Attorney, Agent, or Firm—Finnegan, Henderson, Farabow, Garrett & Dunner, L.L.P.

(57) ABSTRACT

A lithography simulation method includes: taking in design data of a pattern to be formed on a substrate and mask data to prepare a mask pattern used in forming a latent image of the pattern on the substrate by transmission of an energy ray; obtaining the latent image of the pattern by calculation of an intensity of the energy ray; locally changing, at least in a portion corresponding to a pattern of interest, a relative position in a direction of the intensity of the energy ray between a latent image curve and a reference intensity line in accordance with a distance between the pattern of interest and a pattern of a neighboring region, the latent image curve being an intensity distribution curve of the energy ray constituting the latent image, the reference intensity line being defined to specify a position of an edge of the pattern of interest; and calculating a distance between intersections of a portion of the latent image curve corresponding to the pattern of interest and the reference intensity line in the changed relative position to define a line width of interest of the pattern of interest.

8 Claims, 6 Drawing Sheets

| LINE WIDTH (W) [nm] | SPACE (S) [nm] | SHIFT AMOUNT OF th |
|---|---|---|
| 0≦W<100 | 0≦S<100 | 0.0 |
| | 100≦S<200 | 0.02 |
| | 200≦S<300 | 0.03 |
| | 300≦S | 0.05 |
| 100≦W<200 | 0≦S<100 | 0.0 |
| | 100≦S<200 | 0.025 |
| | 200≦S<300 | 0.035 |
| | 300≦S | 0.055 |
| 200≦W | 0≦S<100 | 0.0 |
| | 100≦S<200 | 0.03 |
| | 200≦S<300 | 0.04 |
| | 300≦S | 0.06 |

FIG. 4

| COLUMN 1 | COLUMN 2 | COLUMN 3 | COLUMN 4 | COLUMN 5 |
|---|---|---|---|---|
| DIMENSIONAL VALUE OF DESIGN PATTERN (LS) [nm] | DIMENSIONAL VALUE OF CORRECTED MASK (CONVENTIONAL METHOD) [nm] | DIMENSIONAL VALUE OF CORRECTED MASK (PRESENT EMBODIMENT) [nm] | DIFFERENCE ΔW DUE TO CORRECTED MASK (CONVENTIONAL METHOD) [nm] | DIFFERENCE ΔW DUE TO CORRECTED MASK (PRESENT EMBODIMENT) [nm] |
| 100 | 100 | 100 | 0 | 0 |
| 110 | 112.5 | 113.75 | 3 | −1 |
| 120 | 127 | 128.75 | 8 | 3 |
| 132.5 | 143.75 | 150 | 20 | 2 |
| 150 | 165 | 177.5 | 28 | −3 |
| 172.5 | 192.5 | 210 | 40 | 5 |

LS: LINE AND SPACE PATTERN

FIG. 6

LITHOGRAPHY SIMULATION METHOD AND RECORDING MEDIUM

CROSS REFERENCE TO RELATED APPLICATION

This application claims benefit of priority under 35USC §119 to Japanese patent application No. 2005-204146, filed on Jul. 13, 2005, the contents of which are incorporated by reference herein.

BACKGROUND OF THE INVENTION

1. Field of the Invention

The present invention relates to a lithography simulation method, a mask pattern preparation method, a semiconductor device manufacturing method and recording medium.

2. Related Background Art

In recent years, a semiconductor manufacturing technology has advanced very remarkably, and with rapid progresses of micro pattern forming technologies such as a mask process technology, a photolithography technology and an etching technology, a semiconductor device having a minimum working size of 0.13 µm is nowadays produced in large quantities.

In the days when a pattern size is sufficiently large, a planar shape of an LSI pattern to be formed on the wafer is drawn as a design pattern without modification to prepare a mask pattern faithfully to the design pattern. Then, the mask pattern is transferred onto the wafer by a projection optical system, and an underlayer is etched, whereby the pattern can be formed on the wafer substantially as designed. However, as the miniaturization of the pattern advances, it becomes difficult to form the pattern faithfully in each process, and a problem occurs that a final finishing dimension is not faithful to the design pattern.

To solve the problems, processing (hereinafter referred to as the mask data processing) becomes very important which prepares the mask pattern that is different from the design pattern in consideration of a conversion difference between the processes so that the final finishing dimension becomes equal to a design pattern dimension.

The mask data processing includes OPC processing to correct an optical proximity effect (OPE) and the like in addition to processing to change the mask pattern by use of graphic calculation processing, a design rule checker (D.R.C.) and the like, and the mask pattern is appropriately corrected by these processings so that the final finishing dimension becomes a desired dimension. In recent years, with further miniaturization of a device pattern, a K1 value (K1=W/(NA/λ), wherein W: dimension of the design pattern, λ: exposure wavelength of an exposure apparatus and NA: numerical aperture of a lens for use in the exposure apparatus) in a lithography process is increasingly reduced. As a result, since the OPE tends to further enhance, a load of optical proximity correction (OPC) processing becomes very large. To achieve a high precision of the OPC processing, a mainstream is a model base OPC technique which can calculate an appropriate correction value for each mask pattern by use of a light intensity simulator capable of correctly estimating the OPE.

To perform high-precision correction by the model base OPC, a high-precision lithography simulation technique for reproducing experimental data by calculation becomes very important.

There will be described one example of a lithography simulation method in a conventional technology. First, an optical image (latent image) on predetermined exposure conditions is calculated from a given mask pattern. A Gaussian function with respect to the optical image (latent image) or a multi Gaussian function obtained by weighting several Gaussian functions is subjected to convolutionary integration to thereby form a modulated optical image, and there is defined, as a dimension, a distance between two intersections of an exposure amount distribution curve of the modulated optical image and a reference intensity line for specifying a position of an edge of the pattern. The calculation of the optical image can be determined from the exposure wavelength (λ) of the exposure apparatus, the lens numerical aperture (NA), an illuminative shape, a lens aberration, a focus and the like. The convolutionary integration of the optical image with the Gaussian function means that there is represented, in a simulating manner, a dimensional fluctuation attributable to diffusion of acid of chemically amplitude resist applied onto the wafer. In this manner, in the above conventional technology, the dimension of the pattern to be formed on the wafer can be defined by a parameter of optical calculation determined by the exposure apparatus, the convolutionary integration of the Gaussian function obtained by simulating a resist process, and calculating of the intersection between the reference intensity line and the exposure amount distribution curve of the modulated optical image.

However, in recent years, a dissolution speed of the resist changes with a size of the pattern, a space width between the pattern and an adjacent pattern, magnitude of emitted light intensity and the like, and a dimensional fluctuation due to these influences cannot be predicated correctly by the conventional technique. A dimensional fluctuation due to flare (fog light) of the exposure apparatus cannot be considered completely by the above conventional technique. Since it takes very enormous calculation time to represent such phenomenon by a strict physical model, the technique is not realistic. To solve the problem, heretofore, the distance between the intersections of the reference intensity line of a predetermined intensity position and the exposure amount distribution curve of the optical image has uniformly been defined as the pattern dimension, but several methods have been proposed in which the intensity position of the reference intensity line or the exposure amount distribution curve of the optical image is shifted vertically (light intensity direction) to thereby simply take in the above phenomenon and enhance an estimation precision. These techniques include: a technique of specifying the intensity position where the intensity becomes maximum or minimum in the optical image in the vicinity of the pattern, and determining a shift amount of the optical image in accordance with the maximum or minimum intensity; and a technique of calculating a tilt of the optical image, and determining a shift amount of the optical image in accordance with the tilt. These techniques have an effect of raising a calculation precision with respect to a simple line and space pattern, but such effect cannot necessarily be recognized in many complicated shape patterns existing in actual device patterns. In the pattern having the complicated shape, the shape of the optical image of the pattern is also very complicated. Therefore, it is very difficult to correctly define the maximum or minimum intensity or the tilt of the optical image as in the above method. In a case where the shift amount of the optical image is determined by the light intensity which simply becomes maximum or minimum, or the only tilt of the optical image with respect to the pattern having such complicated optical image, a situation has sometimes occurred in which the calculation precision is deteriorated as compared with the previous technique.

SUMMARY OF THE INVENTION

According to a first aspect of the invention, there is provided a lithography simulation method comprising:

taking in design data of a pattern to be formed on a substrate and mask data to prepare a mask pattern used in forming a latent image of the pattern on the substrate by transmission of an energy ray;

obtaining the latent image of the pattern by calculation of an intensity of the energy ray;

locally changing, at least in a portion corresponding to a pattern of interest, a relative position in a direction of the intensity of the energy ray between a latent image curve and a reference intensity line in accordance with a distance between the pattern of interest and a pattern of a neighboring region, the latent image curve being an intensity distribution curve of the energy ray constituting the latent image, the reference intensity line being defined to specify a position of an edge of the pattern of interest; and calculating a distance between intersections of a portion of the latent image curve corresponding to the pattern of interest and the reference intensity line in the changed relative position to define a line width of interest of the pattern of interest.

According to a second aspect of the invention, there is provided a mask pattern preparation method comprising:

taking in design data of a pattern to be formed on a substrate and mask data to prepare a mask pattern used in forming a latent image of the pattern on the substrate by transmission of an energy ray, the mask pattern having a width thereof defined;

calculating a distance between a pattern to be corrected and a pattern of a neighboring region of the pattern to be corrected on the basis of the design data;

obtaining a latent image of the pattern to be formed on the substrate by calculation of an intensity of the energy ray;

locally changing, at least in a portion corresponding to the pattern to be corrected, a relative position in a direction of the intensity of the energy ray between a latent image curve and a reference intensity line in accordance with the calculated distance, the latent image curve being an intensity distribution curve of the energy ray constituting the latent image, the reference intensity line being defined to specify a position of an edge of the pattern to be corrected; and calculating a distance between intersections of a portion of the latent image curve corresponding to the pattern to be corrected and the reference intensity line in the changed relative position to define the calculated distance as a line width of interest of the pattern to be corrected;

forming the pattern on the substrate to measure an actual line width of the pattern to be corrected;

calculating a difference between the calculated line width of interest and the measured actual line width;

comparing a predetermined threshold value with the difference and newly defining the line width of the mask pattern when the difference is above the threshold value; and repeating obtaining of the latent image of the pattern to newly defining of the line width of the mask pattern until the difference becomes not more than the threshold value.

According to a third aspect of the invention, there is provided a semiconductor device manufacturing method comprising:

preparing a mask by use of a mask pattern preparation method; and performing exposure and development by use of the prepared mask to form a pattern on a substrate;

wherein the mask pattern preparation method including:

taking in design data of a pattern to be formed on a substrate and mask data to prepare a mask pattern used in forming a latent image of the pattern on the substrate by transmission of an energy ray, the mask pattern having a width thereof defined;

calculating a distance between a pattern to be corrected and a pattern of a neighboring region of the pattern to be corrected on the basis of the design data;

obtaining a latent image of the pattern to be formed on the substrate by calculation of an intensity of the energy ray;

locally changing, at least in a portion corresponding to the pattern to be corrected, a relative position in a direction of the intensity of the energy ray between a latent image curve and a reference intensity line in accordance with the calculated distance, the latent image curve being an intensity distribution curve of the energy ray constituting the latent image, the reference intensity line being defined to specify a position of an edge of the pattern to be corrected; and calculating a distance between intersections of a portion of the latent image curve corresponding to the pattern to be corrected and the reference intensity line in the changed relative position to define the calculated distance as a line width of interest of the pattern to be corrected;

forming the pattern on the substrate to measure an actual line width of the pattern to be corrected;

calculating a difference between the calculated line width of interest and the measured actual line width;

comparing a predetermined threshold value with the difference and newly defining the line width of the mask pattern when the difference is above the threshold value; and repeating obtaining of the latent image of the pattern to newly defining of the line width of the mask pattern until the difference becomes not more than the threshold value.

According to a fourth aspect of the invention, there is provided a medium in which a program is recorded to allow a computer to execute a lithography simulation method, the lithography simulation method comprising:

taking in design data of a pattern to be formed on a substrate and mask data to prepare a mask pattern used in forming a latent image of the pattern on the substrate by transmission of energy ray;

obtaining the latent image of the pattern by calculation of an intensity of the energy ray;

locally changing, at least in a portion corresponding to a pattern of interest, a relative position in a direction of the intensity of the energy ray between a latent image curve and a reference intensity line in accordance with a distance between the pattern of interest and a pattern of a neighboring region, the latent image curve being an intensity distribution curve of the energy ray constituting the latent image, the reference intensity line being defined to specify a position of an edge of the pattern of interest; and calculating a distance between intersections of a portion of the latent image curve corresponding to the pattern of interest and the reference intensity line in the changed relative position to define a line width of interest of the pattern of interest.

According to a fifth aspect of the invention, there is provided a medium in which a program is recorded to allow a computer to execute a mask pattern preparation method, the mask pattern preparation method comprising:

taking in design data of a pattern to be formed on a substrate and mask data to prepare a mask pattern used in forming a latent image of the pattern on the substrate by transmission of an energy ray, the mask pattern having a width thereof defined;

calculating a distance between a pattern to be corrected and a pattern of a neighboring region of the pattern to be corrected on the basis of the design data;

obtaining a latent image of the pattern to be formed on the substrate by calculation of an intensity of the energy ray;

locally changing, at least in a portion corresponding to the pattern to be corrected, a relative position in a direction of the intensity of the energy ray between a latent image curve and a reference intensity line in accordance with the calculated distance, the latent image curve being an intensity distribution curve of the energy ray constituting the latent image, the reference intensity line being defined to specify a position of an edge of the pattern to be corrected; and calculating a distance between intersections of a portion of the latent image curve corresponding to the pattern to be corrected and the reference intensity line in the changed relative position to define the calculated distance as a line width of interest of the pattern to be corrected;

calculating a difference between the calculated line width of interest and an actual line width obtained through measurement to a pattern to be corrected which has preliminary formed on the substrate;

comparing a predetermined threshold value with the difference and newly defining the line width of the mask pattern when the difference is above the threshold value; and repeating obtaining of the latent image of the pattern to newly defining of the line width of the mask pattern until the difference becomes not more than the threshold value.

BRIEF DESCRIPTION OF THE DRAWINGS

In the accompanying drawings:

FIG. 4 is a diagram showing one example of a rule table for determining an exposure shift amount;

FIG. 6 is a diagram showing one example of an effect provided by the mask pattern preparation method shown in FIG. 5.

DETAILED DESCRIPTION OF THE INVENTION

Figure 1:
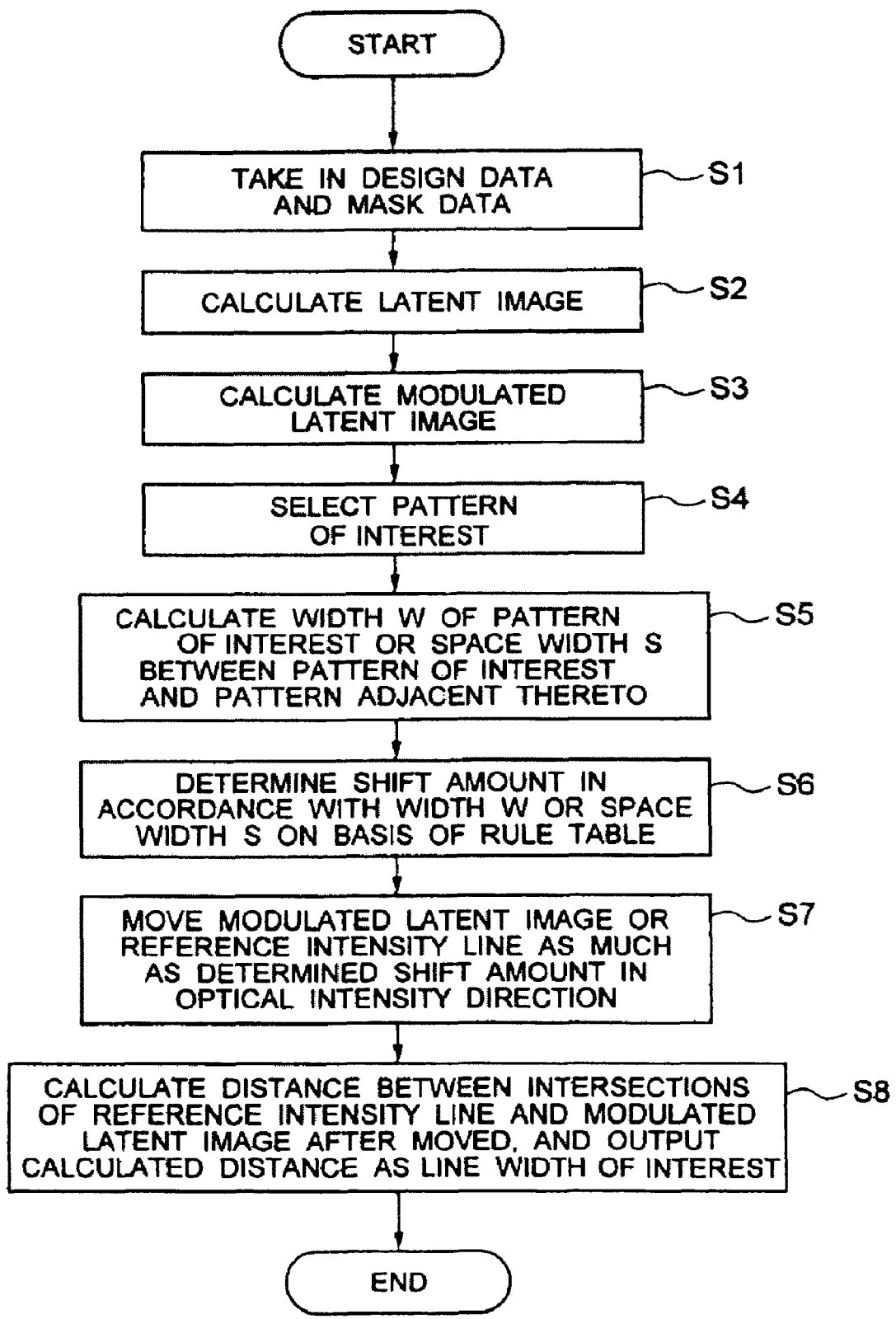
FIG. 1 is a flowchart showing a schematic procedure in one embodiment of a lithography simulation method in the present invention.

There will be described hereinafter embodiments of the present invention with respect to the drawing.

(1) Embodiments of Lithography Simulation Method

1) First Embodiment

Figure 2:
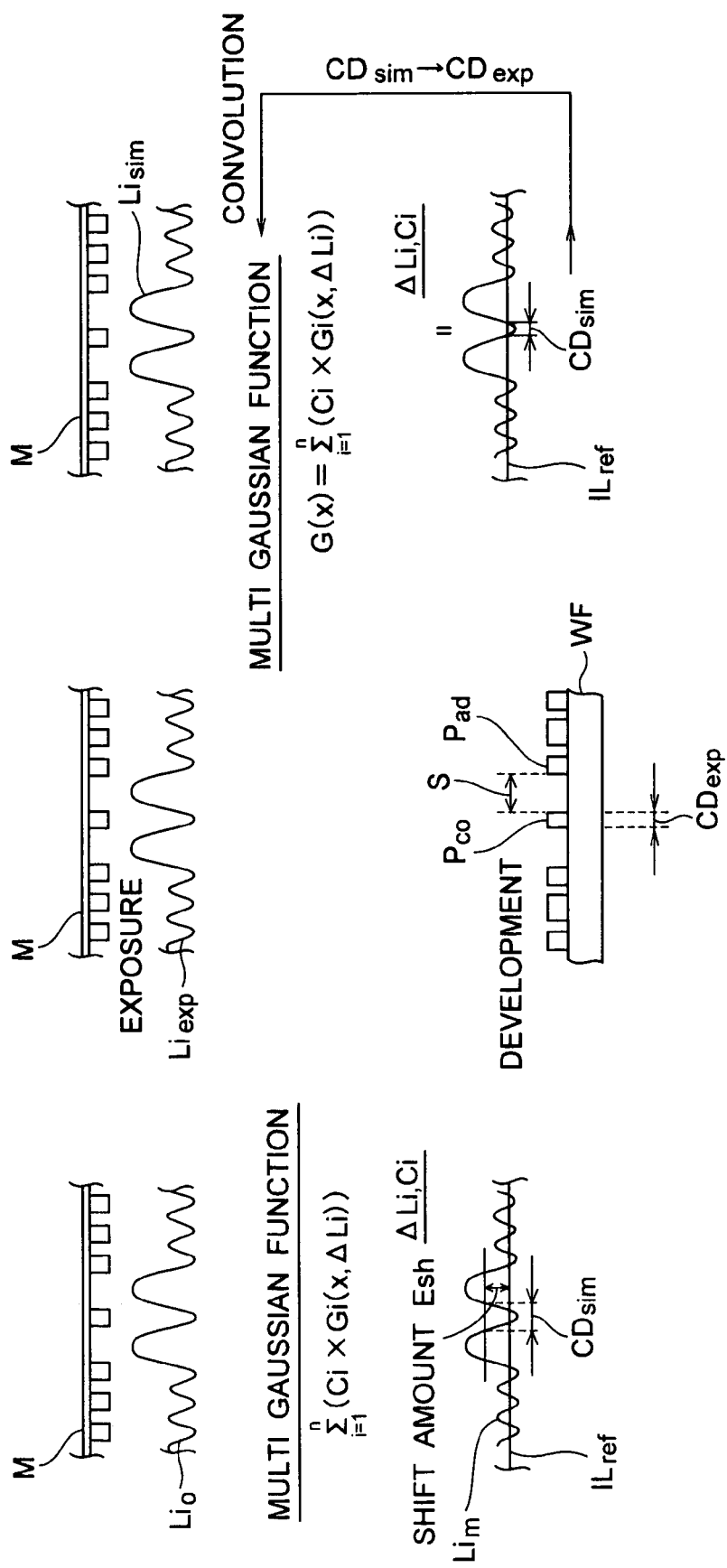
FIGS. 2A and 2B are explanatory views of the lithography simulation method shown in FIG. 1.
FIG. 2C is an explanatory view of the lithography simulation method in a conventional technology.

FIG. 1 is a flowchart showing a schematic procedure in one embodiment of a lithography simulation method of the present invention. FIGS. 2A to 2C are explanatory views of the procedure shown in FIG. 1. FIG. 2A shows the lithography simulation method in the present embodiment, and FIG. 2B shows a behavior in which exposure and development are performed using a mask M actually prepared from data of a mask pattern, and a pattern is formed on a wafer WF. It is to be noted that an explanatory view of a lithography simulation method in a conventional technology is shown as a comparative example in FIG. 2C.

As described in steps S5 to S7 of FIG. 1, one of characteristics of the present embodiment lies in that a relative position in a light intensity direction between a latent image curve and a reference intensity line is locally changed at least in a portion corresponding to a pattern of interest in accordance with the distance between the pattern of interest and a pattern of a neighboring region. The method will be described hereinafter in order from step S1 of FIG. 1.

First, design data of a pattern as a simulation object is taken into a simulator (step S1). This design data includes a parameter of optical calculation defined by an exposure apparatus, in addition to data of a pattern to be formed on the wafer WF and data of a mask pattern (see the mask M of FIG. 2A) obtained by applying transmitted light as a latent image of the above pattern to the wafer. The parameters include, for example, an exposure wavelength ($\lambda$) of the exposure apparatus, a lens numerical aperture (NA), an illuminative shape, a lens aberration, a focus and the like.

Next, an optical image (latent image) on predetermined exposure conditions is calculated based on the mask data (step S2 (see a latent image Li0 of FIG. 2A)). Furthermore, the calculated optical image is subjected to convolutionary integration with a single Gaussian function or a plurality of Gaussian functions to thereby acquire a modulated latent image Lim (step S3). The plurality of Gaussian functions are formed by linearly adding up Gaussian functions weighted using an arbitrary weighting factor. This represents a dimensional fluctuation attributable to diffusion of acid of chemically amplitude resist.

Figure 3:
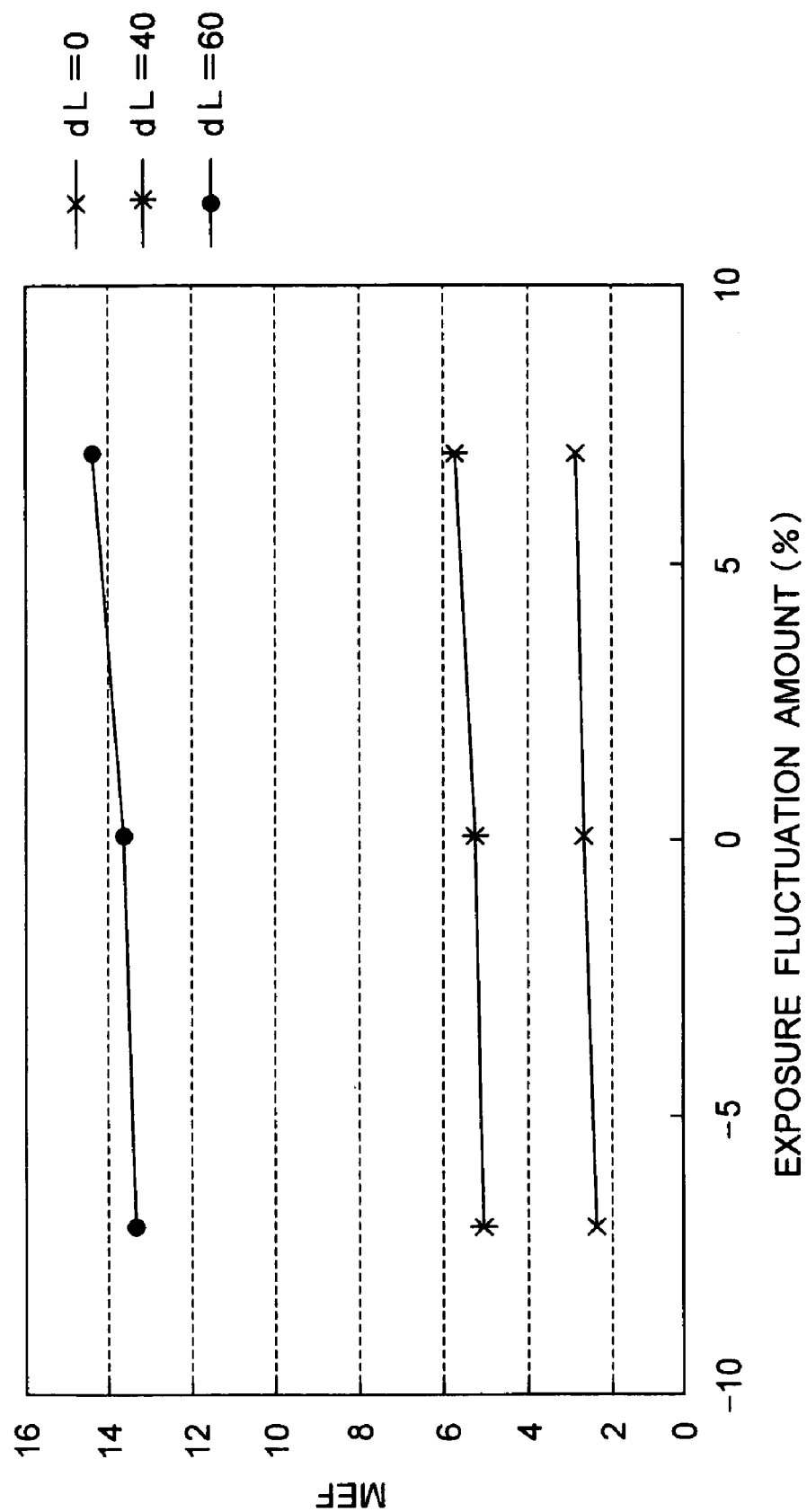
FIG. 3 is a graph showing a non-dependence of an MEF value on an exposure amount.

Here, in a conventional technology, a $\sigma$ value of the Gaussian function for subjecting the optical image to the convolutionary integration is determined so as to reproduce an experiment result CDexp (see FIG. 2B), whereby the modulated latent image has been determined. However, in the present embodiment, there is also considered estimation of a dimensional fluctuation attributable to a dissolution speed characteristic of resist (not shown) and flare. Therefore, to determine the $\sigma$ value of the Gaussian function, it is necessary to select a measurement index which does not depend on an exposure amount (corresponding to, e.g., an irradiation amount of an energy ray with which a substrate is irradiated). In the present embodiment, as the measurement index for determining the $\sigma$ value, a mask-error enhancement factor (MEF) value has been selected. The MEF value is a value indicating a dimensional fluctuation of a pattern dimension on the wafer at a time when a mask pattern dimension fluctuates as much as, for example, 1 nm, and is used as a value indicating a degree of the dimensional fluctuation on the wafer due to a fluctuation of the mask. FIG. 3 shows a result of calculation of the MEF value in a case where the $\sigma$ value of the Gaussian function fluctuates and a case where the exposure amount fluctuates. From FIG. 3, it is seen that the fluctuation of the MEF value is small with respect to the exposure amount, and is large with respect to the $\sigma$ value (denoted with dL in FIG. 3). Therefore, when the $\sigma$ value is determined so as to reproduce the MEF value obtained from the experiment, it is possible to determine the $\sigma$ value of the Gaussian function which does not depend on the exposure amount. This can also apply to a case where each $\sigma$ value and each weighting factor are determined so as to agree with the MEF value obtained by the experiment, when a Gaussian function such as the multi Gaussian function having a plurality of different $\sigma$ values is weighted.

Returning to FIG. 1, after calculating the modulated latent image by use of the $\sigma$ value determined so as to agree with the MEF value obtained by the experiment in this manner (step S3), a pattern whose line width is of interest is selected (step S4), and there is calculated a relative exposure shift amount between an intensity distribution curve (hereinafter referred to as the modulated latent image curve) of the modulated latent image and the reference intensity line (steps S4, S5). The measurement index which does not depend on the exposure amount is selected in determining the σ value, but conversely, it is necessary to select an index which does not depend on the σ value in determining the exposure shift amount. In the present embodiment, as the index which does not depend on the σ value, there are used a designed line width of the pattern of interest and a designed space width between a pattern adjacent to this pattern of interest and the pattern of interest.

A maximum intensity or a minimum intensity of the optical image can uniquely be determined by the width of the pattern of interest or the distance between the pattern of interest and the pattern adjacent to the pattern of interest. To take in the influence of the flare or the like, a technique having a very large calculation load is required. In the strict sense, there is required a technique to calculate a pattern coverage of the order of several hundreds of micrometers from the pattern of interest. On the other hand, as the pattern of interest comes closer, the influence of the flare enlarges. Therefore, when considering at least one of the line width of the pattern of interest and the space width between the pattern adjacent to the pattern of interest and the pattern of interest, it is supposedly possible to consider not a little flare influence. In other words, it is supposed that the dimensional fluctuation attributable to the resist dissolution speed characteristic and the dimensional fluctuation attributable to the flare can be approximated by mainly the width of the pattern and the spatial distance between the pattern and the pattern adjacent to the pattern. This is not a strict technique, but is effective especially in the simulation for the optical proximity correction (OPC) which requires a very large calculation load.

More specifically, returning to FIG. 1, there is calculated, based on the design data, a width W of a pattern Pco of interest (see FIG. 2B) or a space width S (see FIG. 2B) between a pattern Pad (see FIG. 2B) adjacent to the pattern Pco of interest and the pattern Pco of interest (step S5). Next, based on a (offset) rule table prepared beforehand, there is determined a shift amount Esh in accordance with the width W or the space width S calculated in the step S5 (step S6). FIG. 4 shows one example of the (offset) rule table for determining the shift amount Esh. A method of preparing such rule table will be described later.

Subsequently, as shown in a lower diagram of FIG. 2A, the modulated latent image Lim or a reference intensity line ILref is moved as much as the shift amount Esh in an optical intensity direction (step S7).

Finally, there is calculated the distance between intersections of the reference intensity line ILref and the modulated latent image curve Lim after moved, and the resultant value is defined and output as a line width of interest CDsim (step S8).

In this manner, according to the present embodiment, in a case where the shift amount Esh of the exposure amount is determined, even when the pattern of interest has a complicated shape, it is possible to estimate a dimensional fluctuation amount with a high precision incorporating influences of not only diffusion of acid of chemically amplitude resist but also the resist dissolution speed characteristic and the flare. Furthermore, since the fluctuation can be estimated at a high speed by a simple method, it is possible to effectively utilize a computer resource of the simulator.

There will briefly be described one example of a method of preparing the above-described (offset) rule table.

First, by a conventional technique, the convolutionary integration is executed using the Gaussian function having the predetermined σ value to calculate the optical image, and a light intensity position to reproduce the dimension obtained by the experiment is calculated from the resultant optical image.

Next, there is calculated a difference between an intensity position of the reference intensity line in the optical image and the light intensity position (to reproduce the experimental value) obtained by the above procedure.

Subsequently, the pattern width (W) of the pattern of interest and the space width (S) between the pattern adjacent to this pattern of interest and the pattern of interest are sequentially changed by a predetermined notch width of, for example, about 50 nm in a case of a generation of 100 nm, and a difference is calculated every change.

Finally, the resultant difference is defined as the exposure shift amount in accordance with the above pattern width (W) and the space width (S), and recorded in the form of a data table.

2) Second Embodiment

In a lithography simulation method of this embodiment, there will be described a case where an influence of a three-dimensional structure of a photo mask is taken into an exposure shift amount in accordance with a pattern width (W) and a space width (S).

As the widths W, S decrease, a light transmission amount fluctuates due to the influence of the three-dimensional structure of the mask. In general, it is known that in a case where a width of a portion through which light transmits is S, the light transmission amount due to the influence of the three-dimensional structure decreases as the width S decreases. However, to strictly calculate this influence, strict field calculation is required. This requires a calculation amount several tens to several hundreds of times a calculation amount of a conventional technique. The present embodiment is effective in that these influences are simply considered.

Specifically, a) in a case where the widths W, S change, a fluctuation amount (Δdose) of an exposure amount due to the three-dimensional structure of the mask is calculated, and recorded in a table. The prepared table then forms a part of a rule table in the step S6 of FIG. 1. Next, b) the widths W, S of the mask for use in lithography simulation are calculated, and a value of Δdose is referred to from the table obtained in a). Next, c) after the modulated latent image (this image is obtained from the simulation in which any mask three-dimensional structure is not considered) calculated by the simulation is shifted as much as Δdose, a dimension is calculated in a predetermined exposure amount position (position in an intensity direction) (Ie). Alternatively, a dimension is calculated in a position obtained by shifting the position Ie as much as Δdose while the modulated latent image remains as it is (see FIG. 1, step S7). Accordingly, the dimension is calculated (see FIG. 1, step S8). Using such technique, it is possible to simply calculate a dimensional value on a wafer in a case where the influence of the mask three-dimensional structure is considered. The value of Δdose of the step a) may be calculated from an exposure amount difference between a case where the mask three-dimensional structure is considered with a tool capable of calculating the mask three-dimensional structure (capable of calculating an electric field) and a case where the structure is not considered, or the value may be calculated from a difference between an experiment result and a calculation result. Furthermore, the values of Δdose may individually be recorded in a table in accordance with a pattern shape characteristic (e.g., a corner shape, a line end shape). Furthermore, the technique of the above a) to c) may be performed during calculation for optical proximity correction. In general, the calculation for the optical proximity correction is repeatedly performed until a correction value indicates a predetermined precision, but values of the widths W, S of the mask change with the correction value. Therefore, every time the values change, the value of Δdose may be read from the table prepared in the step a), and corrected. If the correction value is small, the value of Δdose may be read once, and the optical proximity correction may be performed with this value. In this manner, when the above simulation method of the first embodiment is approximated as an exposure amount shift due to the influence of the mask three-dimensional structure, it is possible to calculate the dimensional value of a fine pattern on the wafer at a high speed and with a high precision.

(2) Embodiment of Mask Pattern Preparation Method

According to the lithography simulation method of the above embodiment, a line width of a pattern can be estimated with a high precision and at a high speed. Therefore, when this estimation result is fed back to mask data, it is possible to prepare a mask pattern in which there is taken in beforehand a dimensional fluctuation amount due to influences of diffusion of acid of chemically amplitude resist, dissolution speed characteristic of the resist and flare.

There will be described hereinafter an embodiment of a mask pattern preparation method using the above embodiment.

Figure 5:
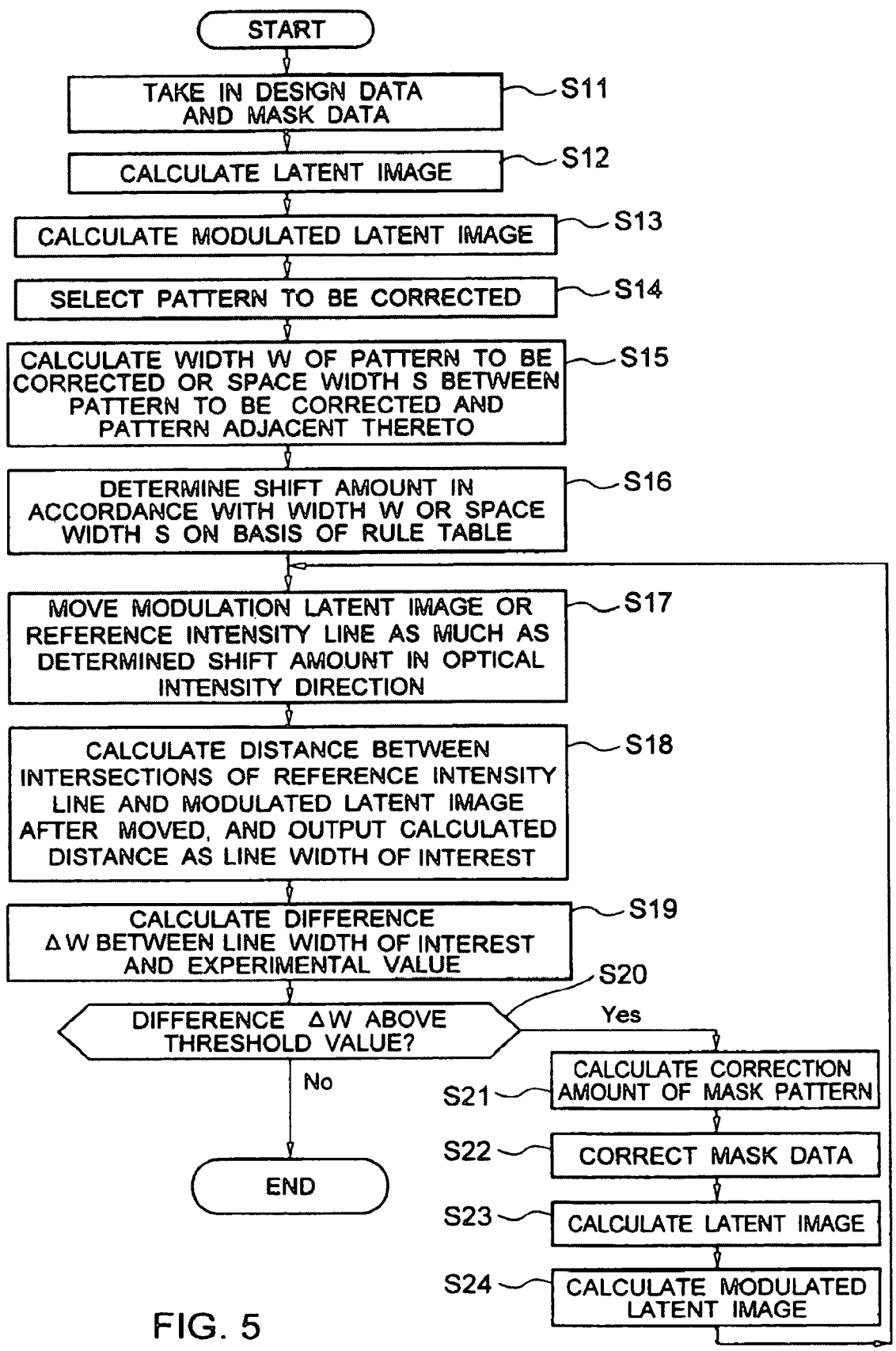
FIG. 5 is a flowchart showing a schematic procedure of one embodiment of a mask pattern preparation method in the present invention.

FIG. 5 is a flowchart showing a schematic procedure of the mask pattern preparation method in the present embodiment. Among procedures shown in the drawing, steps S11 to S13 and S16 to S18 are substantially the same as the steps S1 to S3 and S6 to S8 shown in FIG. 1, respectively, and 10 is simply added to each step number. Moreover, steps S14, S15 shown in FIG. 5 are substantially the same as the steps S4, S5 of FIG. 1 except that the "pattern of interest" in the steps S4 and S5 of FIG. 1 is changed to a "pattern to be corrected", and 10 is simply added to each step number. Therefore, detailed description of procedures in these steps is omitted, and a procedure of and after step S19 of FIG. 5 will mainly be described hereinafter.

First, after a line width of interest is output with respect to a correction object pattern in a procedure similar to that shown in FIG. 1 (steps S11 to S18), there is calculated a difference ΔW between the line width of interest and an experimental value (finishing dimension on a wafer WF) (step S19). Next, the resultant difference ΔW is compared with a predetermined threshold value Wth (step S20). The threshold value Wth is determined by, for example, product specifications.

When the difference ΔW is not more than the threshold value Wth (step S20), it is found that a mask pattern does not have to be corrected. Therefore, preparation of the mask pattern ends with respect to the correction object pattern. On the other hand, if the difference ΔW is above the threshold value Wth (step S20), a correction amount of the mask pattern is calculated (step S21), mask data is corrected in accordance with the calculated correction amount (step S22), and a latent image and a modulated latent image are calculated again based on the corrected mask data (steps S23, S24). A modulated latent image curve or a reference intensity line are moved as much as the exposure shift amount Esh determined beforehand in the step S16 in an optical intensity direction to calculate a line width of interest, and the difference ΔW is calculated again (steps S17 to S19). The above procedure of the steps S17 to S24 is repeated until the difference ΔW becomes not more than the threshold value Wth. In consequence, it is possible to prepare the mask pattern in which a dimensional fluctuation amount is taken in with a high precision in consideration of influences of not only diffusion of acid of chemically amplitude resist but also a dissolution speed characteristic of the resist and flare.

FIG. 6 shows one example of an effect produced by the mask pattern preparation method of the present embodiment. FIG. 6 shows a correction result in a case where OPC processing is executed using the rule table shown in FIG. 4 in the present embodiment in comparison with a correction result of a method of a conventional technology. Columns 1 to 5 show, in order: a design pattern to be corrected; a mask dimensional value after correction performed by a method of the conventional technology; a mask dimensional value after correction performed in the present embodiment; a difference ΔW between a finishing dimension and a line width of interest of the mask on a wafer after the correction performed by the method of the conventional technology; and a difference ΔW between a finishing dimension and a line width of interest of the mask on the wafer after the correction performed in the present embodiment, respectively. As apparent from comparison between the column 4 and the column 5, it can be confirmed that the dimension difference of the present embodiment becomes smaller than that of the method of the conventional technology.

(3) Program

A series of procedures in each of the lithography simulation method and the mask pattern preparation method described above may be incorporated into a program, and read and executed by a computer. In consequence, the series of procedures in each of the lithography simulation method and the mask pattern preparation method of the present invention can be realized using a general-purpose computer. The series of procedures in each of the lithography simulation method and the mask pattern preparation method described above may be stored as the program to be executed by the computer in a recording medium such as a flexible disk or a CD-ROM, and read and executed by the computer. The recording medium is not limited to a portable medium such as a magnetic disk or an optical disk, and a fixed type recording medium such as a hard disk drive or a memory may be used. The program into which there are incorporated a series of procedures of each of the lithography simulation method and the mask pattern preparation method described above may be distributed via a communication circuit (including radio communication) such as internet. Furthermore, the program into which there are incorporated a series of procedures of each of the lithography simulation method and the mask pattern preparation method described above may be distributed via a cable circuit or a radio circuit such as the internet, or may be stored in the recording medium and distributed in a state in which the program is encrypted, modulated or compressed.

(4) Semiconductor Device Manufacturing Method

A mask is prepared using a lithography simulation method or a mask pattern preparation method described above in the embodiments, a mask pattern is exposed on a substrate having resist applied to the top thereof by use of the prepared mask, and the resist having a latent image formed thereon is developed to form the pattern on the substrate. In this case, a dimensional fluctuation of a lithography process can be taken in a process of manufacturing a semiconductor device with a high precision and at a high speed. As a result, it is possible to enhance throughput and yield in the manufacturing of the semiconductor device without requiring, for example, any new manufacturing unit.

Several embodiments of the present invention have been described above, but the present invention is not limited to the above embodiments, and can appropriately be altered or modified without departing from the scope thereof.

What is claimed is:

1. A lithography simulation method comprising:
    taking in design data of a pattern to be formed on a substrate and mask data to prepare a mask pattern used in forming a latent image of the pattern on the substrate by transmission of energy ray;
    obtaining the latent image of the pattern by calculation of an intensity of the energy ray;
    locally changing, at least in a portion corresponding to a pattern of interest, a relative position in a direction of the intensity of the energy ray between a latent image curve and a reference intensity line in accordance with a distance between the pattern of interest and a pattern of a neighboring region, the latent image curve being an intensity distribution curve of the energy ray constituting the latent image, the reference intensity line being defined to specify a position of an edge of the pattern of interest; and
    calculating a distance between intersections of a portion of the latent image curve corresponding to the pattern of interest and the reference intensity line in the changed relative position to define a line width of interest of the pattern of interest.

2. The lithography simulation method according to claim 1,
    wherein the distance is defined by at least one of a width of the pattern of interest and a space width between an adjacent pattern disposed adjacent to the pattern of interest in the neighboring region and the pattern of interest.

3. The lithography simulation method according to claim 1,
    wherein the latent image is a modulated latent image obtained by convolutionary integration of one of a single Gaussian function and a plurality of Gaussian functions, the single Gaussian function having a σ value specified from a measurement index which is independent of an irradiation amount of the energy ray with which the substrate is irradiated, and the plurality of Gaussian functions being formed by linearly adding up the Gaussian functions having the a values by use of an arbitrary weighting coefficient.

4. The lithography simulation method according to claim 3,
    wherein the σ value is determined so as to reproduce an MEF value obtained from an experiment.

5. A medium in which a program is recorded to allow a computer to execute a lithography simulation method, the lithography simulation method comprising:
    taking in design data of a pattern to be formed on a substrate and mask data to prepare a mask pattern used in forming a latent image of the pattern on the substrate by transmission of energy ray; obtaining the latent image of the pattern by calculation of an intensity of the energy ray; locally changing, at least in a portion corresponding to a pattern of interest, a relative position in a direction of the intensity of the energy ray between a latent image curve and a reference intensity line in accordance with a distance between the pattern of interest and a pattern of a neighboring region, the latent image curve being an intensity distribution curve of the energy ray constituting the latent image, the reference intensity line being defined to specify a position of an edge of the pattern of interest; and calculating a distance between intersections of a portion of the latent image curve corresponding to the pattern of interest and the reference intensity line in the changed relative position to define a line width of interest of the pattern of interest.

6. The medium according to claim 5, wherein the distance is defined by at least one of a width of the pattern of interest and a space width between an adjacent pattern disposed adjacent to the pattern of interest in the neighboring region and the pattern of interest.

7. The medium according to claim 5,
    wherein the latent image is a modulated latent image obtained by convolutionary integration of one of a single Gaussian function and a plurality of Gaussian functions, the single Gaussian function having a σ value specified from a measurement index which is independent of an irradiation amount of the energy ray with which the substrate is irradiated, and the plurality of Gaussian functions being formed by linearly adding up the Gaussian functions having the σ values by use of an arbitrary weighting coefficient.

8. The medium according to claim 7,
    wherein the σ a value is determined so as to reproduce an MEF value obtained from an experiment.

* * * * *

UNITED STATES PATENT AND TRADEMARK OFFICE
CERTIFICATE OF CORRECTION

PATENT NO.       : 7,426,712 B2
APPLICATION NO.  : 11/485554
DATED            : September 16, 2008
INVENTOR(S)      : Kotani et al.

It is certified that error appears in the above-identified patent and that said Letters Patent is hereby corrected as shown below:

Claim 3, column 12, line 2, change "the a values" to --the σ values--.

Claim 8, column 12, line 47, change "σ a value" to --σ value--.

Signed and Sealed this

Nineteenth Day of May, 2009

JOHN DOLL
*Acting Director of the United States Patent and Trademark Office*